United States Patent
Sorna

(10) Patent No.: US 7,142,623 B2
(45) Date of Patent: Nov. 28, 2006

(54) ON-CHIP SYSTEM AND METHOD FOR MEASURING JITTER TOLERANCE OF A CLOCK AND DATA RECOVERY CIRCUIT

(75) Inventor: Michael A. Sorna, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 728 days.

(21) Appl. No.: 10/160,541

(22) Filed: May 31, 2002

(65) Prior Publication Data

US 2003/0223526 A1  Dec. 4, 2003

(51) Int. Cl.
*H03D 3/24*  (2006.01)

(52) U.S. Cl. ............... 375/376; 375/371; 375/326

(58) Field of Classification Search ............. 375/376, 375/326, 371, 355, 359, 362, 255, 226; 713/400, 713/401, 500, 503
See application file for complete search history.

(56) References Cited

U.S. PATENT DOCUMENTS

| | | | |
|---|---|---|---|
| 5,056,118 A * | 10/1991 | Sun | 375/342 |
| 5,481,563 A * | 1/1996 | Hamre | 375/226 |
| 5,793,822 A * | 8/1998 | Anderson et al. | 375/371 |
| 5,805,088 A | 9/1998 | Butter et al. | |
| 5,912,928 A | 6/1999 | Chieco et al. | |
| 6,631,144 B1 * | 10/2003 | Johansen | 370/516 |
| 6,661,267 B1 | 12/2003 | Walker et al. | |
| 6,785,832 B1 | 8/2004 | Chieco et al. | |
| 2002/0199125 A1 | 12/2002 | Chieco et al. | |

* cited by examiner

*Primary Examiner*—Temesghen Ghebretinsae
(74) *Attorney, Agent, or Firm*—Daryl K. Neff, Esq.

(57) ABSTRACT

An integrated circuit is operable to measure tolerance to jitter in a data stream signal. A Clock And Data Recovery Circuit ("CDR") thereon recovers a phase of a clock for sampling a data stream signal containing a repeatable known sequence of data values and then samples the data stream signal with the recovered clock phase to obtain data stream sample data. An error rate determination circuit independently generates the repeatable known sequence of data values and compares them with the data stream sample data to determine an associated error rate. A control circuit coupled to the CDR delays the recovered clock phase by a predetermined amount a plurality of times and monitors the error rate after each time it delays the recovered clock phase. In this way, a maximum delayed clock phase is determined, representing a right timing signal margin for which the data stream signal can be sampled.

9 Claims, 3 Drawing Sheets

ON-CHIP SYSTEM AND METHOD FOR MEASURING JITTER TOLERANCE OF A CLOCK AND DATA RECOVERY CIRCUIT

FIELD OF THE INVENTION

The present invention relates to testing of electronic circuitry and more specifically to an on-chip system and method for measuring the jitter tolerance of a clock and data recovery circuit.

BACKGROUND OF THE INVENTION

As integrated circuits increase in complexity, systems and methods must be capable of testing them to their limits, if the functionality under expected operating conditions is to be proven. Many advanced integrated circuits are operating too fast and are becoming too complex to be tested only by external test equipment. In place of external test equipment, more and more testing is being performed by circuitry implemented on the integrated circuit itself as built-in-self-test (BIST) circuitry. However, as the BIST circuitry becomes more complex, new systems and methods are needed to assure that integrated circuit functions are tested to the full limits they are required to operate.

One type of data receiver used in integrated circuits is capable of receiving data bit signals from an incoming data line without requiring a separate clock signal to be transmitted on a separate line from the data line. Such data receiver is known as a Clock and Data Recovery Circuit ("CDR") because the phase and frequency of the clock signal is recovered from the data line signal(s) along with the transmitted data bits.

A particular requirement of an on-chip data receiver, including a clock and data recovery circuit, is that it be tolerant to signal jitter. FIG. 1 shows bit signals 200 as they appear at the input to a receiver. The bit signals 200 include two complementary signals which swing at periodic intervals, according to their data content. In such example, the bit time, defined as the average time between signal transitions, is 400 picoseconds (pS). However, due to the characteristics of the transmitter and the transmission line, and other influences between the transmitter and the CDR, the signal transitions 202 have jitter. The jitter is manifested as a period of time 203 during which the state of the complementary data signals is uncertain because of variations in the arrival of the signal transitions. Because of the jitter, the clock signal used to sample the data signal is best adjusted to a phase 204 which lies at the midpoint of the bit time between transitions. In operation, this sampling clock signal must be continually adjusted in phase in order to match the transmitted clock signal. As the incoming data signal varies, it may often take several clock cycles to adjust the sampling clock signal to the correct phase at the midpoint between signal transitions. High frequency signal jitter which occurs over fewer clock cycles must be tolerated by assuring that there be large enough timing margins between the ideal sampling clock phase 204 at the bit time midpoint, and the jitter in the left and right transitions of the data signal.

In order to assure satisfactory operation under expected conditions, a robust system and method is needed to test the jitter tolerance of a clock and data recovery circuit.

SUMMARY OF THE INVENTION

Accordingly, the present invention provides an integrated circuit including an on-chip system and a method for measuring the jitter tolerance of a clock and data recovery loop. Such clock and data recovery loop determines a clock phase for sampling a data stream on a data line by examining transitions of the data stream.

The on-chip system includes a control circuit coupled to the clock and data recovery loop which is adapted to receive an error rate associated with sampling the data stream with the clock phase determined by the clock and data recovery loop. The on-chip system is adapted to delay the clock phase by a predetermined amount one or more times, and to monitor the error rate to determine a maximum delayed clock phase for sampling the data stream, the maximum delayed clock phase representing a right timing signal margin.

The on-chip system is preferably adapted to determine a left timing signal margin, as well, by being adapted to advance the clock phase by a predetermined amount one or more times, and to monitor the error rate to determine a maximum advanced clock phase for sampling the data stream.

An on-chip method of measuring the jitter tolerance of a clock and data recovery loop is provided which includes a) determining a clock phase for sampling a data stream on a data line by examining transitions of the data stream;

b) delaying the clock phase by a predetermined amount;

c) sampling the data stream with the delayed clock phase and determining an error rate for the sampled data stream;

d) further delaying the delayed clock phase by the predetermined amount; and e) repeating steps c) and d) zero or more times to determine a maximum delayed clock phase for sampling the data stream, the maximum delayed clock phase representing a right timing signal margin.

Preferably, the on-chip method additionally includes advancing the clock phase by a predetermined amount one or more times, and monitoring the error rate to determine a maximum advanced clock phase for sampling the data stream, the maximum advanced clock phase representing a left timing signal margin.

DETAILED DESCRIPTION OF THE PREFERRED EMBODIMENTS

Figure 2:
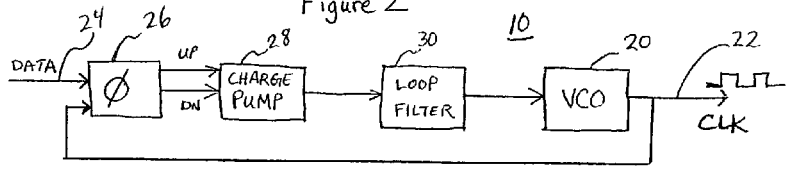
Figure 3:
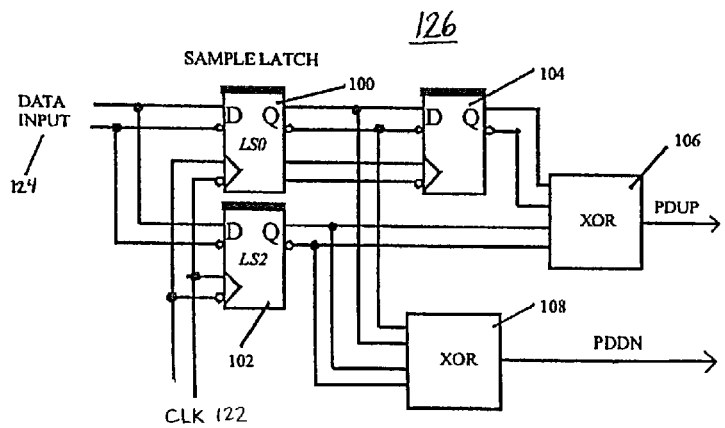
Figure 4:
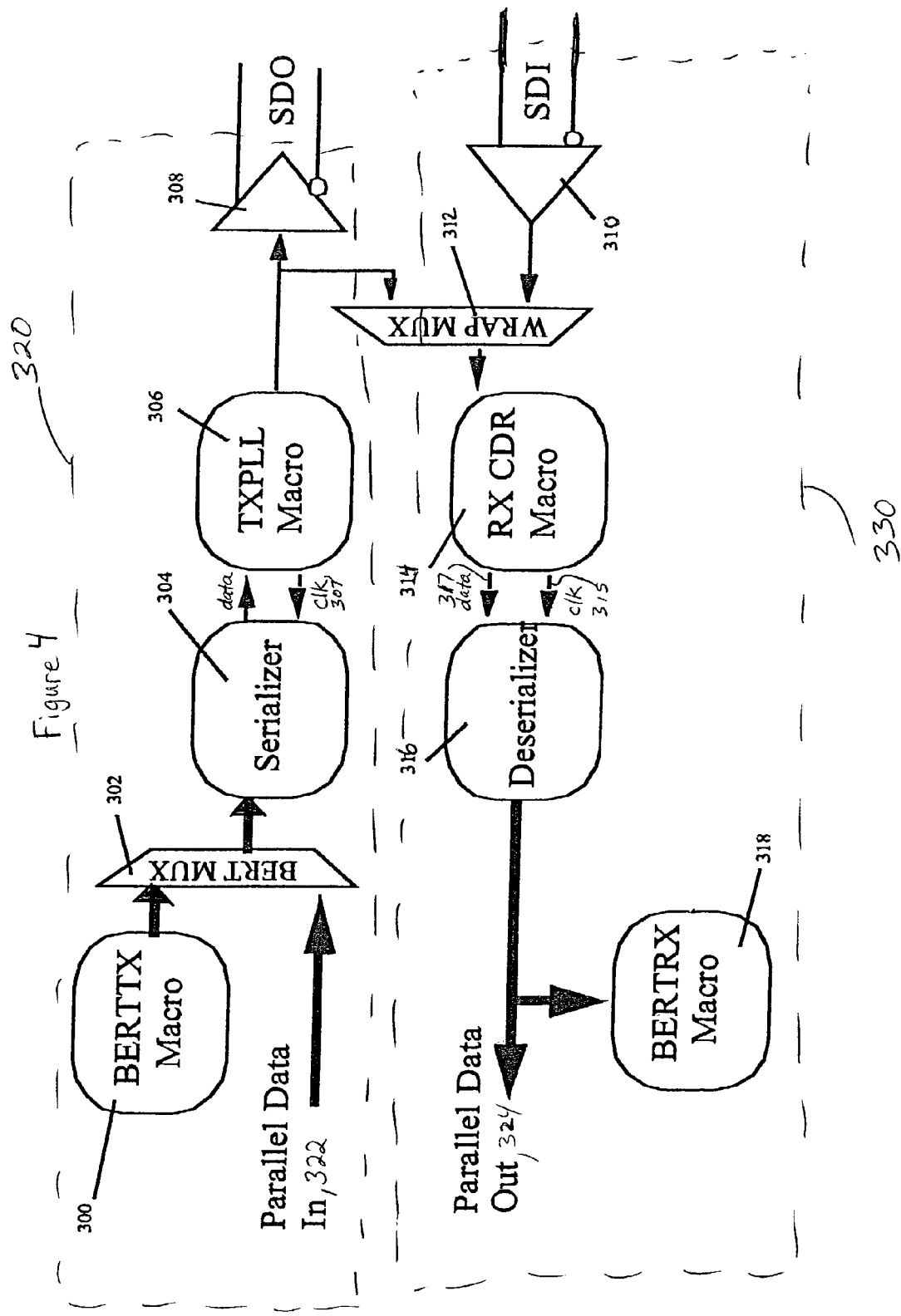

FIGS. 2 through 4 illustrate features of an on-chip system which is described as background to the present invention, but is not admitted to be prior art. FIG. 2 is a block diagram illustrating a clock recovery loop portion 10 of a clock and data recovery circuit (CDR), for use in recovering the clock phase of a data signal from a transmission line within an integrated circuit. The clock recovery loop is a phase lock loop (PLL) which includes a voltage controlled oscillator 20 which generates a clock signal 22 which is phase adjusted to sample the data signal 24 from the transmission line. To acquire and maintain phase lock, the generated clock signal 22 is provided as a feedback input, together with the data signal 24, to the bang-bang phase detector 26, which provides up and down phase control inputs to a charge pump 28.

The charge pump 28, in turn, is coupled to a loop filter 30 which provides a control input to the VCO 20 to complete the clock recovery loop.

Figure 1:
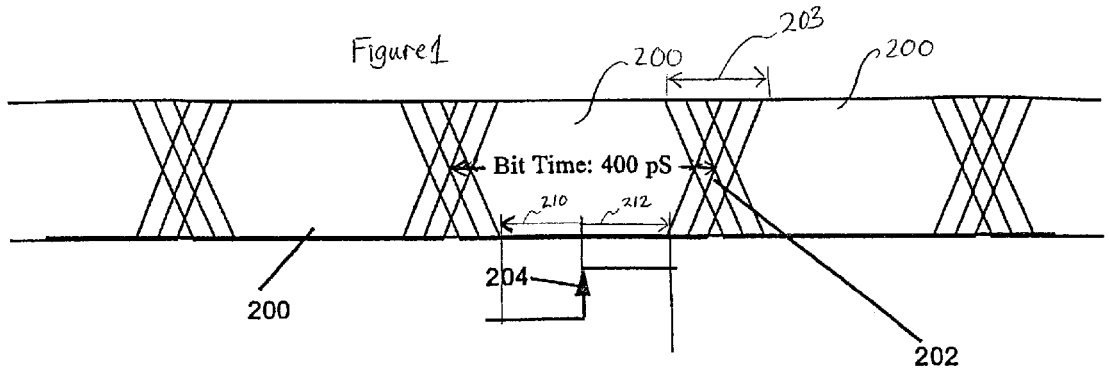
FIGS. 1 to 4 illustrate functions, operations, and circuit blocks representing background to the present invention.

FIG. 3 is a schematic diagram illustrating the detailed structure of an exemplary bang-bang phase detector 126, such as can be used as the bang-bang phase detector 26 in the clock recovery loop 10 shown in FIG. 1. The bang-bang phase detector 126 examines the transitions of a data signal 124 from a transmission line together with the clock signal 122 generated by a VCO 20 in the loop to produce digital outputs for adjusting the clock phase. The bang-bang phase detector 126 gets its name from the fact that it provides up/down outputs for adjusting the clock phase, up or down, by a discrete amount, rather than as a continuously variable phase function. The output PDUP adjusts the clock phase by a discrete, predetermined amount upward, and the output PDDN adjusts the clock phase by a discrete, predetermined amount downward.

FIG. 4 is a block diagram which illustrates elements of an on-chip serial data transceiver, together with additional elements for determining a bit error rate of transceiver elements. As shown in FIG. 4, a transmitter portion 320 of the transceiver includes a serializer 304, which serializes parallel data from either a parallel data input stream 322 or a repeating pseudo-random bit sequence from a bit error rate transmit macro (BERTTX) 300, as selected by BERT multiplexer 302. Serialized data is passed to a transmitter phase lock loop (TXPLL) macro 306, which in turn passes the data serially to serial driver 308. The TXPLL macro 306 also establishes a clock signal 307 used to clock data out from serializer 304. Serial driver 308 then drives serial data on complementary serial data output lines (SDO).

As also shown in FIG. 4, a receiver portion 330 of the transceiver includes a receiver 310 coupled to receive signals on complementary serial data input lines (SDI). Receiver 310 can be implemented, for example, by a linear amplifier which may have fixed gain. In normal operation, the output of receiver 310 is provided to a receiver clock and data recovery (RXCDR) macro 314 through WRAP multiplexer 312. The RXCDR macro 314 samples the output signal from receiver 310 to recover a serial data bit signal 317 from serial data input lines SDI and the clock phase, as represented by clock signal 315. The recovered data bit signal 317 and clock phase 315 are passed to deserializer 316 which then provides output as a parallel data stream 324.

The data transceiver shown in FIG. 4 also provides for a built-in-self-test (BIST) mode, which tests the bit error rate between transmitter portion 320 and receiver portion 330. In such mode, known, as a "serial wrap" test, the BERT multiplexer 302 selects and passes a pseudo-random bit sequence output of the BERTTX macro 300 through the transmitter 320, and the WRAP multiplexer 312 selects and passes the transmitter output, from the TXPLL macro 306, to the receiver 330. The transmitted pseudo-random bit sequence is recovered and deserialized by the RXCDR macro 317 and deserializer 316, respectively, and then provided as a parallel data output stream 324 to a bit error rate receiver macro (BERTRX) 318. The BERTRX macro 318, having circuitry for locally generating a replica of the pseudo-random bit sequence transmitted from the BERTTX macro 300, checks the received data stream for errors and reports an error rate to a BIST controller (not shown).

Unfortunately, for several reasons, the jitter tolerance of the receiver portion 330 cannot be effectively tested during a serial wrap test. First, the transmitted signal has little jitter because it is locally wrapped directly from the transmitter portion 320 to the receiver portion 330, without being transmitted across serial data lines SDO and SDI, and therefore, has not been subjected to the distortions of the transmission channel. Second, the sample clock 122 of the bang-bang phase detector 126 is phase locked to the data signal 124, and is also phase-adjusted to the midpoint 204 of the bit time (FIG. 1). Thus, the system illustrated in FIG. 4 does not test, and has no provision for determining the actual left and right timing signal margins 210, 212 between the midpoint 204 and the left and right signal jitter, respectively.

Figure 5:
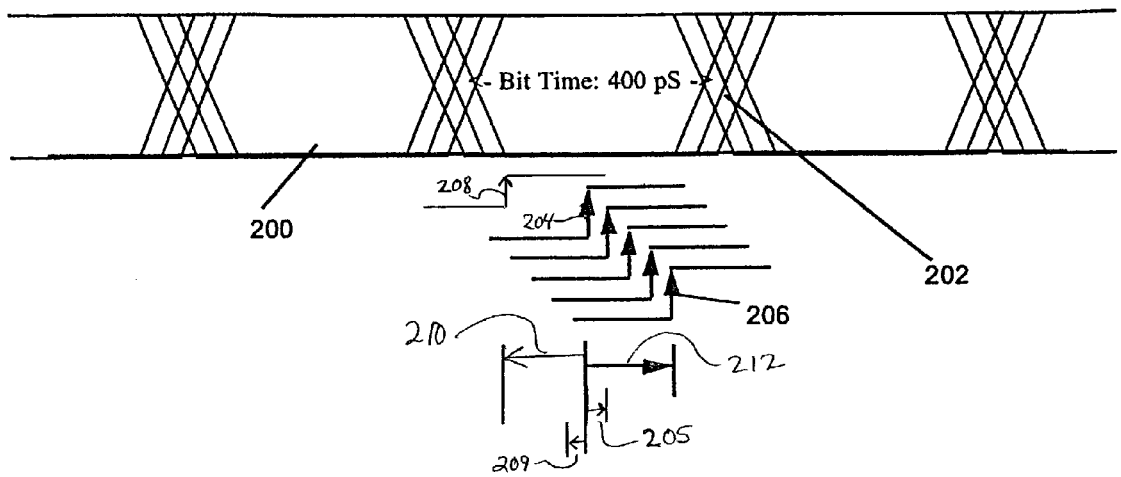
FIGS. 5 and 6 illustrate additional functions, operations and circuit blocks in accordance with a preferred embodiment of the invention.

Accordingly, the present invention proposes to modify the bang-bang phase detector 126 described above relative to FIG. 3, such that the phase of the sample clock 122 is adjusted incrementally, by discrete predetermined amounts, to test the jitter tolerance of the receiver 330. In so doing, the left and right timing signal margins 210, 212 (FIG. 1) are determined. As illustrated by FIG. 5, in the method provided by the invention, the sample clock phase is delayed from the midpoint 204, by a predetermined discrete amount (205). A pseudo-random bit sequence is then transmitted from BERT generator 300 to BERT receiver 318, and the bit error rate of the system is then checked. If the bit error rate is zero, or is within an acceptable limit, then the right timing signal margin 212 has not yet been reached. In such case, the sample clock phase is then delayed by twice the predetermined discrete amount 205 as measured from the midpoint 204, and the bit error rate is then checked again. If the bit error rate is still zero or within an acceptable limit, the right timing signal margin 212 has still not been reached. The sample clock phase is then delayed again, this time by three times the predetermined discrete amount 205, as measured from the midpoint 204. The bit error rate is then checked again. This process continues until reaching a phase 206 which corresponds to a right timing signal margin 212. Beyond the right timing signal margin, the jitter becomes apparent by an unacceptable increase in the bit error rate. In such manner a maximum delayed clock phase is determined, that phase corresponding to a right timing signal margin 212.

A similar process is performed to determine a left timing signal margin 210. In this case, the sample clock phase is advanced from the midpoint 204, by a predetermined discrete amount (209). A pseudo-random bit sequence is then transmitted from BERT generator 300 to BERT receiver 318, and the bit error rate of the system is then checked. If the bit error rate is zero, or is within an acceptable limit, then the left timing signal margin 210 has not yet been reached. In such case, the sample clock phase is then advanced by twice the predetermined discrete amount 209 as measured from the midpoint 204, and the bit error rate is then checked again. If the bit error rate is still zero or within an acceptable limit, the left timing signal margin 210 has still not been reached. The sample clock phase is then advanced again, this time measured by three times the predetermined discrete amount 209 from the midpoint 204. The bit error rate is then checked again. This process continues until reaching a phase 208 which corresponds to a left timing signal margin 210. Beyond the left timing signal margin, the jitter becomes apparent by an unacceptable increase in the bit error rate.

The addition of the right timing signal margin 212 to the left timing signal margin 210 together makes up the jitter tolerance of the data transceiver (FIG. 4). It will be understood that the right timing signal margin 212 determined under test may not be the same as the left timing signal margin 210. This could be the case, for example, if the nominal phase of the sample clock 122 were not centered at the midpoint 204. From such determination, one might infer that a static phase error is present in the transceiver. A static phase error might be caused, for example, by a current imbalance in the charge pump 28 or by leakage in the loop filter 30 (FIG. 2).

Figure 6:
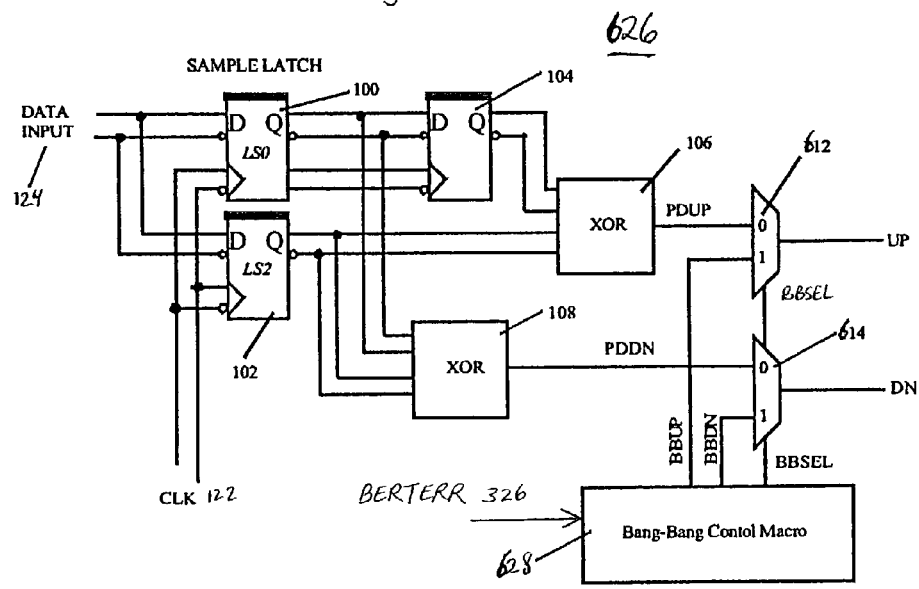

FIG. 6 illustrates a modified bang-bang phase detector 626 which is adapted to advance or delay the phase of a sample clock 122 by a predetermined discrete amount each time, in order to facilitate the method described above with reference to FIG. 5. Bang-bang phase detector 626 includes the following additional functions, in addition to the functions and circuit blocks of bang-bang phase detector 126 described above with reference to FIG. 3: a bang-bang control macro 628, and multiplexers 612 and 614. The bang-bang control macro 628 provides control outputs BBUP and BBDN, for adjusting the phase of the sample clock 122 up or down, respectively, by a predetermined discrete amount. The BBSEL output of bang-bang control macro 628 causes multiplexers 612 and 614 to select the BBUP and BBDN outputs, at appropriate times, as the UP and DN outputs of the bang-bang phase detector 626. In addition, the bang-bang control macro 628, receives a signal BERTERR, representing the bit error rate detected by the BERTRX macro 318 during a serial wrap test.

In operation, the bang-bang control macro 628 is activated during a serial wrap test to force shifts in the phase of the sample clock 122 which is used to sample serial data as received by the RXCDR macro 314 of receiver 330 (FIG. 4). Thus, in an exemplary embodiment, testing begins with the BERTTX macro 300 generating a pseudo-random bit sequence, which is passed by BERT MUX 302 to serializer 304, and then transmitted serially on through TXPLL macro 306, through WRAP MUX 312 and then to RXCDR macro 314, of which bang-bang phase detector 626 forms a part. The BBSEL output of bang-bang control macro 628 is initially disabled for a sufficient time to allow sample clock 122 to become phase locked to the incoming serial data signal from WRAP MUX 312. After such time, the sample clock 122 will have a phase set to the midpoint 204 of the bit time, as described above with reference to FIG. 5.

The bang-bang control macro 628 then activates the BBSEL and BBDN outputs to begin testing the jitter tolerance of the transceiver (FIG. 4), beginning with testing a right timing signal margin 212. The BBSEL output is activated while the BBDN output is activated, in order to force a delay in the sample clock phase from the midpoint 204 by a predetermined discrete amount (205). The BBSEL output is then deactivated, and the bang-bang phase detector 626 is permitted to operate normally again, such that it begins to acquire, or acquires phase lock again with the data signal 124, which is provided from the BERTTX macro 300. The bit error rate of the system is then checked by BERTRX macro 318 and the results signaled back to the bang-bang control macro 628. If the bit error rate is zero, or is within an acceptable limit, then the right timing signal margin 212 has not yet been reached.

In such case, the bang-bang control macro 628 forces a delay in the phase of the sample clock 122 again, this time by activating BBSEL and BBDN for sufficient time to delay the sample clock phase by twice the predetermined discrete amount 205, as measured from the midpoint 204. Thereafter, the BBSEL and BBDN signals are deactivated, and normal operation of bang-bang phase detector 626 resumes again, at which time the bit error rate is checked again by the BERTRX macro 318, and results signaled back to the bang-bang control macro 628.

If the bit error rate is still zero or within an acceptable limit, the right timing signal margin 212 has still not been reached. The sample clock phase is then delayed again by activating the BBSEL and BBDN signals, this time by three times the predetermined discrete amount 205, as measured from the midpoint 204, and then deactivated again, such that normal operation of bang-bang phase detector resumes 626. The bit error rate is checked again. This process continues until reaching a phase 206 which corresponds to a right timing signal margin 212. Beyond the right timing signal margin, the jitter becomes apparent by an unacceptable increase in the bit error rate. In such manner a maximum delayed clock phase is determined, that phase corresponding to a right timing signal margin 212.

A left timing signal margin 210 is determined by operation analogous to that described immediately above, except that the BBSEL output is activated together with the BBUP output, instead of the BBDN output, such that the sample clock phase is advanced by predetermined discrete amounts from the midpoint 204 on each pass, until a maximum advanced clock phase is determined, that phase corresponding to a left timing signal margin 210.

While the invention has been described herein in accordance with certain preferred embodiments thereof, those skilled in the art will recognize the many modifications and enhancements which can be made without departing from the true scope and spirit of the present invention, limited only by the claims appended below.

What is claimed is:

1. An integrated circuit including an on-chip clock and data recovery circuit operable to measure tolerance to jitter in a data stream signal, comprising:
    a multiplexer operable to select a data stream signal for output, said data stream signal having a repeatable known sequence of data values;
    a clock and data recovery circuit ("CDR") coupled to receive the data stream signal output by the multiplexer, said CDR being operable to recover a phase of a clock for sampling said data stream signal by examining transitions of said data stream signal, and to sample said data stream signal with said recovered clock phase to obtain data stream sample data;
    an error rate determination circuit operable to locally generate a replica of said repeatable known sequence of data values and to compare said data values of said locally generated replica with said data stream sample data to determine an error rate associated with obtaining said data stream sample data
    wherein said CDR includes a control circuit operable to delay said recovered clock phase by a predetermined amount a plurality of times, and said error rate determination circuit is operable to monitor said error rate each time after said control circuit delays said recovered clock phase, such that a maximum delayed clock phase is determined for sampling said data stream signal, said maximum delayed clock phase representing a right timing signal margin.

2. The integrated circuit of claim 1 wherein said control circuit is further operable to advance said recovered clock phase by said predetermined amount a plurality of times and to monitor said error rate after advancing said recovered clock phase each of said times, such that a maximum advanced clock phase is determined for sampling said data stream signal, said maximum advanced clock phase representing a left timing signal margin.

3. The integrated circuit of claim 1 wherein said control circuit is further operable to repetitively delay said recovered clock phase by said predetermined amount until said error rate becomes non-zero, said maximum delayed clock phase being determined as a last delayed clock phase after which said error rate becomes non-zero.

4. The integrated circuit of claim 2 wherein said control circuit is further operable to repetitively advance said recovered clock phase by said predetermined amount until said error rate becomes non-zero, said maximum advanced clock phase being determined as a last advanced clock phase after which said error rate becomes non-zero.

5. An on-chip method of measuring a tolerance to jitter in a data stream signal, comprising:
   a) recovering a phase of a clock for sampling a data stream signal on a data line by examining transitions of said data stream signal, said data stream signal containing a repeatable known sequence of data values;
   b) locally generating a replica of said repeatable known sequence of data values;
   c) delaying said recovered clock phase by a predetermined amount to provide a delayed clock phase;
   d) sampling said data stream signal with said delayed clock phase to obtain data stream sample data and determining a first error rate by comparing said data stream sample data with said data values of said locally generated replica
   e) further delaying said delayed clock phase by said predetermined amount; and
   f) repeating said steps d) and e) zero or more times to determine a maximum delayed clock phase for sampling said data stream signal, said maximum delayed clock phase representing a right timing signal margin.

6. The method of claim 5 further comprising:
   g) advancing said recovered clock phase by a predetermined amount to provide an advanced clock phase;
   h) sampling said data stream signal with said advanced clock phase to obtain second data stream sample data and determining a second error rate by comparing said second data stream sample data with said data values of said locally generated replica;
   i) further advancing said advanced clock phase by said predetermined amount; and
   j) repeating said steps h) and i) zero or more times to determine a maximum advanced clock phase for sampling said data stream signal, said maximum advanced clock phase representing a left timing signal margin.

7. The method of claim 6 further comprising determining an eye width of said data stream signal from said maximum delayed clock phase and said maximum advanced clock phase.

8. The method of claim 6 wherein said steps d) and e) are repeated until said first error rate becomes non-zero, and said maximum delayed clock phase is determined from a last delayed clock phase after which said first error rate becomes non-zero.

9. The method of claim 6 wherein said steps d) and e) are repeated until said first error rate becomes non-zero, said maximum delayed clock phase being determined from a last delayed clock phase after which said first error rate becomes non-zero zero, said steps h) and i) are repeated until said second error rate becomes non-zero, said maximum advanced clock phase being determined from a last advanced clock phase after which said second error rate becomes non-zero.

* * * * *